(12) United States Patent
Pohl et al.

(10) Patent No.: US 10,197,377 B2
(45) Date of Patent: Feb. 5, 2019

(54) METHOD OF OPERATING A CAPACITIVE PROXIMITY SENSOR AND CAPACITIVE PROXIMITY SENSOR

(71) Applicant: BROSE FAHRZEUGTEILE GMBH & CO. KOMMANDITGESELLSCHAFT, HALLSTADT, Hallstadt (DE)

(72) Inventors: Florian Pohl, Ebersdorf (DE); Holger Wuerstlein, Zeil am Main (DE); Christoph Brand, Bad Koenigshofen (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 769 days.

(21) Appl. No.: 14/807,275

(22) Filed: Jul. 23, 2015

(65) Prior Publication Data

US 2015/0330767 A1    Nov. 19, 2015

Related U.S. Application Data

(63) Continuation of application No. PCT/EP2014/051239, filed on Jan. 22, 2014.

(30) Foreign Application Priority Data

Jan. 23, 2013    (DE) .................. 10 2013 001 066

(51) Int. Cl.
*G01B 7/02* (2006.01)
*G01R 27/26* (2006.01)
(Continued)

(52) U.S. Cl.
CPC ............. *G01B 7/023* (2013.01); *G01R 27/26* (2013.01); *H03K 17/955* (2013.01); *G01D 5/2405* (2013.01); *H03K 2217/960775* (2013.01)

(58) Field of Classification Search
CPC ........ G01D 5/24; G01D 5/241; G01D 5/2412; G06K 9/0002; G01R 27/26; G01R 27/2605
(Continued)

(56) References Cited

U.S. PATENT DOCUMENTS 3,826,979 A    7/1974    Steinmann
6,066,954 A    5/2000    Gershenfeld et al.
(Continued)

FOREIGN PATENT DOCUMENTS

CN    102687042 A    9/2012
CN    202441178 U    9/2012
(Continued)

*Primary Examiner* — Giovanni Astacio-Oquendo
(74) *Attorney, Agent, or Firm* — Laurence A. Greenberg; Werner H. Stemer; Ralph E. Locher

(57) ABSTRACT

During operation of a capacitive proximity sensor that is provided with at least two measuring electrodes, a first capacitance measurement variable and a second capacitance measurement variable are detected. The first capacitance measurement variable is correlated with the capacitance of at least one of the measuring electrodes to earth, while the second capacitance measurement variable is correlated with the capacitance between at least one of the measuring electrodes and at least one further measuring electrode. A change in the first capacitance measurement variable is evaluated together with a synchronous signal profile of the second capacitance measurement variable in order to distinguish a proximity of a conductor coupled electrically to earth from the proximity of dielectric matter. In this manner, a body part passing into the detection space of the proximity (Continued)

sensor can be distinguished effectively from other substances and objects, particularly water.

10 Claims, 3 Drawing Sheets

(51) Int. Cl.
*H03K 17/955* (2006.01)
*G01D 5/24* (2006.01)

(58) Field of Classification Search
USPC ....... 324/694, 519, 548, 658, 661, 662, 669, 324/671, 684, 686, 76.79, 76.81, 123 R, 324/123 C
See application file for complete search history.

(56) References Cited

U.S. PATENT DOCUMENTS

| | | |
|---|---|---|
| 6,283,504 B1 | 9/2001 | Stanley et al. |
| 6,286,504 B1 | 9/2001 | Suginobu |
| 6,486,673 B1 | 11/2002 | Goldfine et al. |
| 6,559,658 B1 | 5/2003 | Brandt |
| 6,781,387 B2 | 8/2004 | Goldfine et al. |
| 7,545,154 B2 | 6/2009 | Wagner et al. |
| 7,878,075 B2 | 2/2011 | Johansson et al. |
| 9,910,053 B2* | 3/2018 | Bakhru ............... G01N 33/4905 |
| 2003/0151572 A1* | 8/2003 | Kumada ............... G09G 3/3614 |
| | | 345/87 |
| 2005/0179415 A1 | 8/2005 | Nakano et al. |
| 2009/0146827 A1 | 6/2009 | Wuerstlein et al. |
| 2012/0043971 A1 | 2/2012 | Maharyta |
| 2012/0044199 A1 | 2/2012 | Karpin et al. |
| 2012/0192489 A1 | 8/2012 | Pribisic |
| 2014/0266262 A1* | 9/2014 | Taghibakhsh ........ G06K 9/0002 |
| | | 324/686 |
| 2014/0320144 A1* | 10/2014 | Nakaya ................ H01M 10/54 |
| | | 324/434 |
| 2015/0030217 A1* | 1/2015 | Wickboldt .......... G06K 9/00026 |
| | | 382/124 |
| 2017/0264110 A1* | 9/2017 | Toya ..................... H02J 7/0021 |

FOREIGN PATENT DOCUMENTS

| | | |
|---|---|---|
| DE | 19983956 T1 | 12/2002 |
| EP | 1012530 B1 | 12/2002 |
| EP | 1828524 B1 | 11/2010 |
| GB | 1444986 | 8/1976 |
| WO | 2009023334 A2 | 2/2009 |
| WO | 2009088361 A1 | 7/2009 |

* cited by examiner

METHOD OF OPERATING A CAPACITIVE PROXIMITY SENSOR AND CAPACITIVE PROXIMITY SENSOR

CROSS-REFERENCE TO RELATED APPLICATION

This is a continuation application, under 35 U.S.C. § 120, of copending international application No. PCT/EP2014/051239, filed Jan. 22, 2014, which designated the United States; this application also claims the priority, under 35 U.S.C. § 119, of German patent application No. DE 10 2013 001 066.7, filed Jan. 23, 2013; the prior applications are herewith incorporated by reference in their entirety.

BACKGROUND OF THE INVENTION

Field of the Invention

The invention relates to a capacitive proximity sensor, in particular for use in a motor vehicle.

A capacitive proximity sensor generally contains an electrode arrangement having one or more measuring electrodes, which are used to set up an electric field in a spatial region (detection area) in front of the particular electrode. The presence of a body part or object in the detection area is identified by monitoring the electrical capacitance of the electrode arrangement. This exploits the phenomenon that a body part or object affects the electric field generated by the sensor and hence affects the capacitance of the electrode arrangement.

In a common configuration of such a capacitive proximity sensor, the electrode arrangement contains two types of measuring electrodes, namely at least one transmit electrode and at least one receive electrode. In this configuration, the transmit electrode or each transmit electrode is connected to a signal generator circuit for generating the electric field, whereas the at least one receive electrode is connected to a receive circuit for measuring the capacitance. Such a sensor measures the capacitance formed between the transmit electrode and the receive electrode, i.e. the capacitance of the capacitor formed from the transmit electrode and the receive electrode, or a measured value that correlates with the capacitance (transmitter-receiver principle).

In an alternative configuration of a capacitive proximity sensor, the electrode arrangement of the sensor contains only one measuring electrode or a plurality of measuring electrodes of the same type (i.e. measuring electrodes that are not classified as receive electrodes and transmit electrodes). In this configuration, this at least one measuring electrode is used to set up an electric field with respect to ground. Thus such a sensor measures the capacitance formed between the at least one measuring electrode and ground or a measured value that correlates with the capacitance (single-electrode principle).

Capacitive proximity sensors are used in modern automobile technology in particular as sensors for a pinch-protection or collision-protection device in an adjustable, in particular automatically adjustable, vehicle part, such as a side window, a vehicle door, a trunk lid etc. On identifying a body part or object in the detection area, such a sensor outputs a detection signal that stops or reverses the actuating movement of the vehicle part.

Capacitive sensors, however, disadvantageously respond not only to the approach of body parts but also to the presence of water in the detection area. The reason for this is that even a small amount of water has a strong influence on the sensor capacitance because of the high permittivity (dielectric constant) of water. This can result in malfunctions of the sensor used as the pinch-protection or collision-protection sensor if the associated vehicle is exposed to rain or washing water.

European patent application EP 1 828 524 B1, corresponding to U.S. Pat. No. 7,545,154, discloses a capacitive sensor and an associated operating method. In this sensor, in order to distinguish a water-induced event from the approach of a body part, a group of at least two measurements in succession is always made, the sensor being operated at different frequencies or pulse duty factors in these measurements. If the sensor signal varies between the individual measurements in a group, this suggests the presence of water. In contrast, the sensor identifies the approach of a body part from the sensor signal being substantially the same for all measurements in the group.

SUMMARY OF THE INVENTION

The object of the invention is to define a capacitive sensor and an associated operating method, both of which make it possible to distinguish particularly easily yet effectively a body part penetrating the detection area of the sensor from other substances and objects, in particular water.

According to the method, the proximity sensor captures a first measured capacitance value and a second capacitance value. The first measured capacitance value is here correlated with the capacitance of at least one of the measuring electrodes with respect to ground, whereas the second measured capacitance value is correlated with the capacitance between the measuring electrodes. In other words, in order to determine the first measured capacitance value, the sensor performs a measurement according to the single-electrode principle described in the introduction (single-electrode measurement). In contrast, a measurement according to the transmitter-receiver principle described in the introduction (transmitter-receiver measurement) is performed to determine the second measured capacitance value. In the context of the invention, both measurements can be performed in any chronological order. Preferably, however, the measurements are performed at exactly the same time or at least at a short time interval so that the ambient conditions of the sensor that determine the capacitance do not change substantially between the measurements. The measured capacitance values can either represent the respective capacitances directly or be uniquely related (linearly or non-linearly) to the capacitances.

According to the method, a change in the first measured capacitance value is analyzed jointly with a synchronous signal waveform of the second measured capacitance value in order to distinguish an approach to the sensor of an electrical conductor electrically coupled to ground (by conductive or capacitive coupling) from the approach of dielectric material. A synchronous signal waveform of the second measured capacitance value is understood to mean the variation of the second measured capacitance value over a time interval that is related in time to a captured change in the first measured capacitance value, in particular occurs simultaneously. The joint analysis of the measured capacitance values may include, for example, comparing the direction of the change in the first measured capacitance value with the direction of a change in the second measured capacitance value. In an advantageous embodiment, this is achieved by combining the two measured capacitance values additively (in particular by forming the difference) or multiplicatively.

The joint, in particular comparative, analysis of the changes in the first and second measured capacitance values is used here particularly to distinguish an approach of a body part from water penetrating the sensor detection area.

The invention is based on the knowledge that the electrical nature of a material penetrating the sensor detection area has a different effect on the measurable capacitance according to the detection principle of the sensor.

Thus introducing a ground-coupled conductor into the detection area of a sensor operated according to the single-electrode principle normally increases the measurable capacitance because the conductor forms a counter electrode at a comparatively small distance from the measuring electrode of the sensor. For a sensor operated according to the transmitter-receiver principle, on the other hand, the approach of a ground-coupled conductor normally reduces the measurable capacitance of the sensor arrangement because the conductor shields the sensor measuring electrodes from each other to some extent.

Introducing a dielectric medium into the field of the sensor, however, increases the measurable capacitance in each case, i.e. both for a measurement based on the single-electrode principle and for a measurement based on the transmitter-receiver principle.

In other words, the approach of a ground-coupled conductor manifests itself in an opposite manner in the measurable capacitance in the two sensor designs, whereas a dielectric medium affects the capacitance of both sensor types in common.

The invention uses this finding by combining the inherently alternative operating principles in one capacitive proximity sensor in order to obtain an extra piece of information about the electrical nature of a detected object by joint, in particular comparative, analysis of the measured capacitance values obtained on the basis of each of the two operating principles.

With regard to detecting a human body or body part, the invention is also based on the consideration that although the human body forms a dielectric medium in the electric field of the sensor, primarily because of the water content of the human body, the body also has an electrical conductivity and owing to conductive and/or capacitive coupling to the earth's surface (ground) acts as a counter electrode to the sensor measuring electrode. It is known that the latter effect predominates. Thus the human body in the field of a capacitive sensor can be considered more as a ground-coupled conductor than as a dielectric. As is known, this property can be used as a simple and effective way of distinguishing body parts from water (in particular rain or washing water).

The first measured capacitance value and the second measured capacitance value are advantageously determined by being correlated in a corresponding manner with the capacitance of the transmit electrode with respect to ground and with the capacitance between the transmit electrode and the receive electrode respectively. In other words, the first measured capacitance value and the second measured capacitance value reflect a change in the respective capacitances preferably in an identical or at least similar manner so that the two measured capacitance values, as a measure of the magnitude of the respective capacitances, can be compared directly with one another.

In particular, the two measured capacitance values are directly proportional to the magnitude of the respective capacitances.

The approach of a ground-coupled electrical conductor, in particular a body part, is preferably detected on identifying an opposite change in the two measured capacitance values, whereas the approach of dielectric material, in particular water, is detected on identifying a common change in the two measured capacitance values.

In addition, the approach of a ground-coupled electrical conductor, in particular a body part, is preferably also detected on identifying a change in the first measured capacitance value that is not accompanied by a synchronous change in the second measured capacitance value. Thus advantageously the approach of a body part can also be identified reliably when water simultaneously present in the detection area interferes with this approach event such that these two events in terms of their effect on the capacitance of the electrode arrangement cancel each other out entirely or partially in the two-electrode measurement. Thus in particular, unlike for a simple single-electrode measurement or a simple two-electrode measurement, the approach of a person in a very wet environment (e.g. heavy rain) can be identified and distinguished from an event caused purely by water.

On detecting a body part in the detection area of the sensor, in particular a detection signal is generated and/or a safety measure is initiated. For a sensor used as a pinch-protection device in an actuating mechanism for a movable vehicle part, the safety measure in particular consists in stopping or reversing an actuating movement of the vehicle part. In contrast, on detecting dielectric material, for instance water, in the detection area, the detection signal and/or the safety measure is suppressed. According to the invention, however, it is possible to generate a different detection signal in this case.

The (proximity) sensor according to the invention contains an electrode arrangement having two measuring electrodes. The sensor also contains at least one signal generator for generating an electrical transmit signal for one of the measuring electrodes, and at least one receive circuit for capturing a capacitance-dependent response signal from which a measured capacitance value can be derived.

The "response signal" denotes generally an electrical value produced by the transmit signal and having a magnitude that depends on the electrode-arrangement capacitance to be measured. The response signal consequently effectively constitutes the capacitance-dependent response of the electrode arrangement to the excitation by the transmit signal, and the size of the electrical current that flows to the measuring electrode connected to the receive circuit under the action of the transmit signal is preferably measured as this response signal (the current flowing away from the measuring electrode as a result of the transmit signal accordingly produces negative values of the response signal here). Alternatively, however, according to the invention, another capacitance-dependent value can also be used as the response signal, for instance the phase angle between the transmit signal and the current flow produced by this signal.

The sensor also contains a control unit, which is configured in circuitry and/or programmed to implement automatically the method according to the invention, in particular in one of the embodiment variants described above.

The control unit preferably contains a microcontroller in which are programmed in the form of a control program (firmware) the functions for automatic implementation of the method. According to the invention, however, the control unit can also be formed entirely or partially by a non-programmable electronic hardware circuit, for example a logic circuit.

In principle according to the invention, separate signal generator circuits and/or receive circuits can be provided for the single-electrode measurement and for the transmitter-receiver measurement. Thus the sensor can comprise two signal generator circuits and/or receive circuits, of which one is used solely for the single-electrode measurement and the other is used solely for the transmitter-receiver measurement. In an especially simple sensor configuration, however, one and the same signal generator circuit and one and the same receiver circuit are used both for the single-electrode measurement and the transmitter-receiver measurement.

In an advantageous embodiment variant of the sensor, the signal generator circuit is permanently connected to one of the measuring electrodes for this purpose. In this case, the sensor hence has a permanent transmit electrode, which is used to emit the electric field both for the single-electrode measurement and for the transmitter-receiver measurement. The receive circuit, on the other hand, can be connected alternately either likewise to this transmit electrode or to the other measuring electrode (receive electrode). The receive circuit can hence be switched between the transmit electrode and the receive electrode. In the state in which the connection is to the transmit electrode, the receive circuit is used here to capture a first response signal that represents the first measured capacitance value. In contrast, in the state in which the connection is to the receive electrode, the receive circuit is used to capture a second response signal that represents the second measured capacitance value.

In an alternative embodiment variant of the sensor, the receive circuit is permanently connected to one of the measuring electrodes, whereas the signal generator circuit can be switched alternately between this measuring electrode and the other measuring electrode. In the first case, the receive circuit is used to measure a first response signal representing the first measured capacitance value. In the second case, the receive circuit can be used to measure a second response signal representing the second measured capacitance value.

Embodiments of the invention also include a control unit of the above-described type per se, i.e. without the remaining elements of the sensor, and a computer program product. The control unit is configured in circuitry and/or programmed to implement automatically the method according to the invention, in particular in one of the embodiment variants described above. The computer program product contains, in particular in a non-volatile memory medium such as a CD-ROM or hard disk for instance, machine-readable instructions which when executed implement automatically the method according to the invention, in particular in one of the embodiment variants described above. The computer program product is in particular intended and suitable for execution in the control unit, in this case a microcontroller-based control unit, of the capacitive proximity sensor.

Other features which are considered as characteristic for the invention are set forth in the appended claims.

Although the invention is illustrated and described herein as embodied in a method for operating a capacitive proximity sensor and a capacitive proximity sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Corresponding parts and variables are always denoted by the same reference signs in all the figures.

Figure 1:
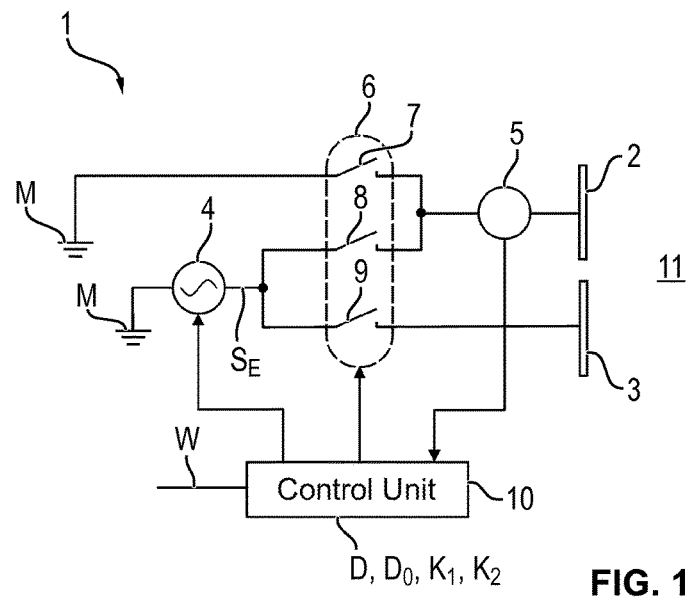
FIG. 1 is a block diagram of a capacitive (proximity) sensor containing an electrode arrangement, which has two measuring electrodes, and has a signal generator circuit, a receive circuit and a control unit according to the invention.

Referring now to the figures of the drawings in detail and first, particularly to FIG. 1 thereof, there is shown in simplified form a capacitive (proximity) sensor 1, which is used, for example, as a component of a pinch-protection system in a motor-vehicle actuating mechanism operated by an electric motor, in particular in an electric window.

The sensor 1 contains a first measuring electrode 2, a second measuring electrode 3, a signal generator circuit 4, a receive circuit 5 and a switching apparatus 6, which in the example shown is formed by three switches 7, 8 and 9. The sensor 1 also contains a control unit 10.

The measuring electrode 2 is connected in series with the receive circuit 5. The receive circuit 5 is in turn connected in series with the switching apparatus 6. The receive circuit 5 can be connected here via the switches 7 and 8 of the switching apparatus 6 alternately either to ground M or to the signal generator circuit 4. The signal generator circuit 4 can be reversibly connected to the measuring electrode 3 via the switch 9 of the switching apparatus 6. The switches 7, 8 and 9 are formed in particular by semiconductor switching elements.

The signal generator circuit 4 is used to generate a transmit signal $S_E$, under the action of which an electric field F (FIG. 2 and FIG. 3) is generated by one of the measuring electrodes 2 or 3 in a detection area 11 in front of one of the measuring electrodes 2, 3. The transmit signal $S_E$ is generated in the form of a voltage that varies periodically with respect to ground M. The signal generator circuit 4 is formed, for instance, by an electric oscillator (resonant circuit) for this purpose.

The receive circuit 5 is used to capture a response signal $A_1$ (FIG. 2) or $A_2$ (FIG. 3), which is correlated with the electrical capacitance measurable at the measuring electrode 2. The size of the current flowing to the measuring electrode 2, under the direct or indirect influence of the transmit signal $S_E$, is measured as the response signal $A_1$ or $A_2$ (current flowing from the measuring electrode 2 is measured as a negative quantity in the response signal $A_1$, $A_2$). The receive circuit 5 is formed by a transimpedance amplifier, for example, for this purpose.

The control unit 10 controls the signal generator circuit 4 and the switches 7-9 of the switching apparatus 6. It also receives continuously from the receive circuit 5 measured values of the response signal $A_1$ or $A_2$ as an input variable, for instance in the form of a current-proportional voltage. The control unit 10 is here in a preferred embodiment formed by a microcontroller, in which a control program (firmware) is implemented in executable form for automatic operation of the sensor 1.

Figure 2:
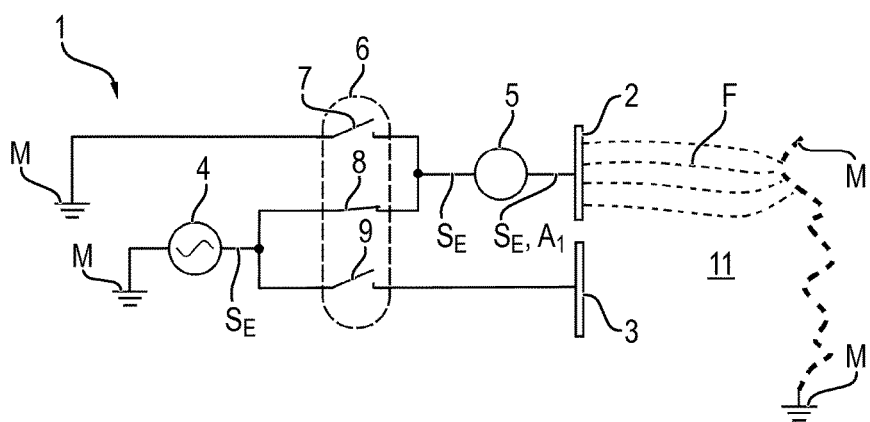
FIG. 2 is a block diagram that corresponds to FIG. 1 of the sensor where the capacitance between a measuring electrode and ground is being measured (single-electrode measurement)
Figure 3:
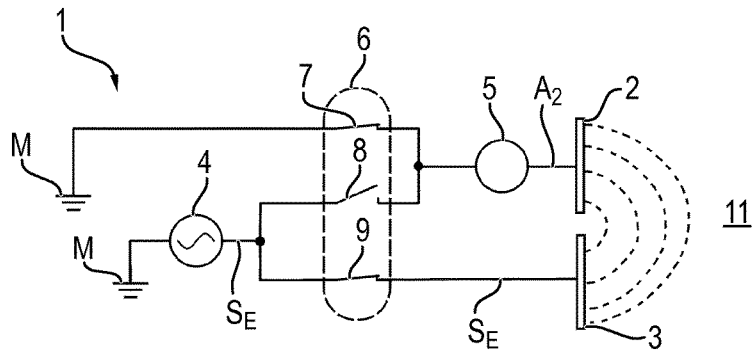
FIG. 3 is a block diagram that corresponds to FIG. 1 of the sensor where the capacitance between the two measuring electrodes is being measured (transmitter-receiver measurement)

The sensor 1 is intended to be operated by the control unit 10 in two operating states, which are shown in FIG. 2 and FIG. 3. Neither FIG. 2 nor FIG. 3 show the control unit 10 purely for reasons of clarity.

In the operating state shown in FIG. 2, to perform a single-electrode measurement the control unit 10 closes the switch 8 to connect the measuring electrode 2 to the signal generator circuit 4 via the receive circuit 5. The control unit 10 opens the switches 7 and 9, however, with the result that in particular the measuring electrode 3 is electrically isolated from the environment. As an alternative to this, the measuring electrode 3 can also be taken to a defined electric potential. This potential can be constant over time or, for example, can track the potential of the measuring electrode 2 in the sense of a "driven shield".

The electric field F generated under the action of the transmit signal $S_E$, in the operating state shown in FIG. 2, extends between the measuring electrode 2 and ground M, i.e. electrical conductors in the environment of the sensor 1 that are grounded or capacitively coupled to ground M. Hence the response signal $A_1$ captured in the single-electrode measurement depends on the electrical capacitance of the measuring electrode 2 with respect to ground M.

In the alternative operating state shown in FIG. 3, to perform a transmitter-receiver measurement the control unit 10 closes the switches 7 and 9 while opening the switch 8 to connect the measuring electrode 2 to ground M via the receive circuit 5 and to connect the measuring electrode 3 to the signal generator circuit 4.

The electric field F generated under the action of the transmit signal $S_E$, in the operating state shown in FIG. 3, extends primarily between the measuring electrode 2 and the measuring electrode 3. Hence the response signal $A_2$ captured in the transmitter-receiver measurement depends on the capacitance formed between the measuring electrodes 2 and 3 (i.e. the capacitance of the capacitor formed by the measuring electrodes 2 and 3).

During operation of the sensor 1, the control unit 10 switches to and fro alternately in time between the operating states shown in FIG. 2 and FIG. 3. Thus by appropriate control of the switching apparatus 6, the control unit 10 captures alternately a measured value of the response signal $A_1$ in a single-electrode measurement and a measured value of the response signal $A_2$ in a transmitter-receiver measurement. The control unit 10 derives from the measured values of the response signal $A_1$ and the response signal $A_2$, and taking into account the transmit signal $S_E$, an associated measured capacitance value $K_1$ and $K_2$ respectively. The measured capacitance values $K_1$ and $K_2$ are here proportional to the respective capacitances measurable by the single-electrode measurement and the transmitter-receiver measurement.

The control unit 10 compares every pair of values of the measured capacitance values $K_1$ and $K_2$ captured consecutively in time, checking for changes that signify an approach of a body part or non-conducting material (in particular water) to the sensor 1.

Figure 4:
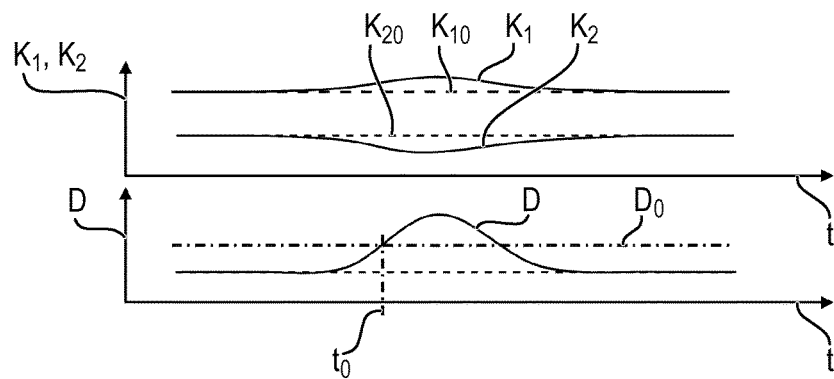
FIG. 4 is a graph showing in two synchronous sub-graphs arranged one above the other a typical variation of a first measured capacitance value captured by the sensor during the single-electrode measurement, and of a second measured capacitance value captured by the sensor during the transmitter-receiver measurement (top graph), and of a difference signal formed from the first and second measured capacitance values (bottom graph) for the case in which a body part temporarily approaches the sensor.
Figure 5:
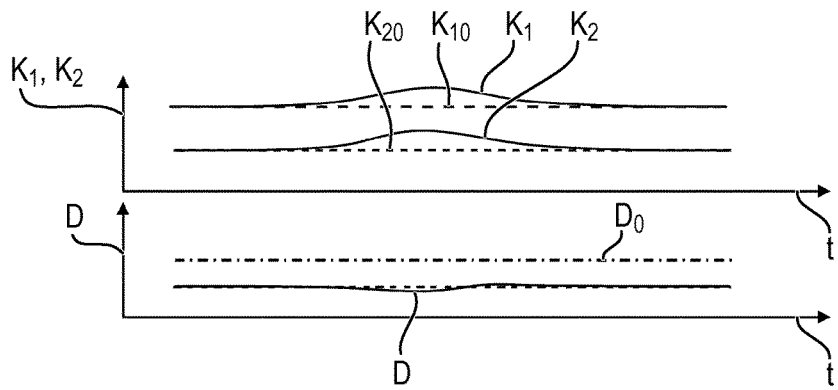
FIG. 5 is a graph that corresponds to FIG. 4 showing the typical variation of the first and second measured capacitance values (top graph) and of the difference signal (bottom graph) for the case in which water is temporarily present in the environment of the sensor.

In a preferred embodiment of the sensor 10, the control unit 10 does this by calculating from the measured capacitance values $K_1$ and $K_2$ shown in FIG. 4 and FIG. 5 a difference signal D (where $D=K_1-K_2$), and compares the difference signal with a saved threshold value $D_0$.

If the difference signal D exceeds the threshold $D_0$ ($D>D_0$) then the control unit 10 outputs a detection signal W. As part of a pinch-protection system, the detection signal W initiates as an anti-pinch safety measure reversal of an actuating movement of the associated motor-vehicle actuating mechanism. When the sensor 1 is used in a power window, the detection signal W causes the window movement to reverse, for instance.

As explained in greater detail with reference to FIG. 4 and FIG. 5, the analysis described above can be used to distinguish a change in the measured capacitance values $K_1$ and $K_2$ caused by a body part from a change in the measured capacitance values $K_1$ and $K_2$ caused by water (or another non-conductor), with the detection signal W being generated only in the former case.

The top graph of FIG. 4 shows here a typical variation of the measured capacitance values $K_1$ and $K_2$ over time t when a body part temporarily approaches the sensor 1. It is evident from the diagram that the measured capacitance values $K_1$ and $K_2$ in this case vary in opposite directions because of the effects described above. The synchronously opposite change in the measured capacitance values $K_1$ and $K_2$ is magnified in the difference signal D, with the result that this signal exceeds the threshold value $D_0$ at a point in time $t_0$, as shown in the bottom graph of FIG. 4.

In contrast, the temporary penetration of water into the detection area 11 results in a synchronous change in the measured capacitance values $K_1$ and $K_2$ in the same direction, as shown in FIG. 5, which is at least approximately canceled out in the difference signal D. In other words, the penetrating water causes at most a slight change in the difference signal D, with the result that this signal does not exceed the threshold value $D_0$ in this case, and consequently the detection signal W is not actuated.

Figure 6:
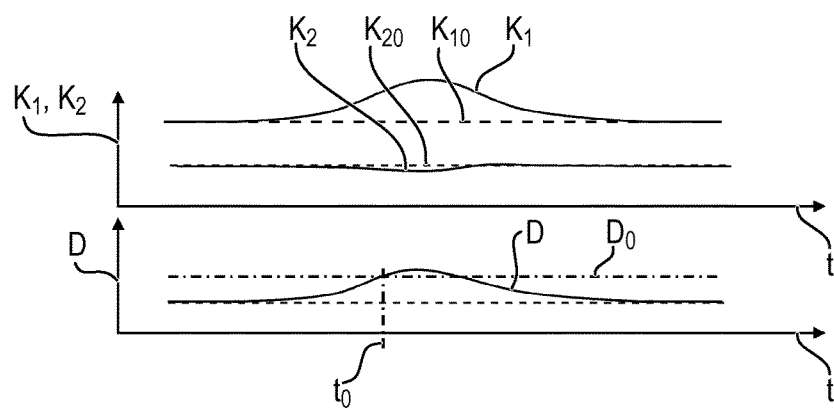
FIG. 6 is a graph that corresponds to FIG. 4 showing the possible variation of the first and second measured capacitance values (top graph) and of the difference signal (bottom graph) for the case in which both water and a body-part simultaneously approach the sensor.

In a case described with reference to FIG. 6, in which water and a body part simultaneously penetrate the detection area 11, it can happen, as shown, that these two approach events cancel each other out in terms of their effect on the second measured capacitance value $K_2$. This dual approach event hence results in a detectable change only in the measured capacitance value $K_1$, whereas the magnitude of the measured capacitance value $K_2$ alters only slightly or not at all in the time period of this change. The change in the measured capacitance value $K_1$, however, again produces a sufficient change in the difference signal D, so that this signal exceeds the threshold value $D_0$ at point in time $t_0$, as shown in the bottom graph in FIG. 6.

Thus the risk of water erroneously actuating the capacitive pinch-protection system is reduced effectively.

Figure 7:
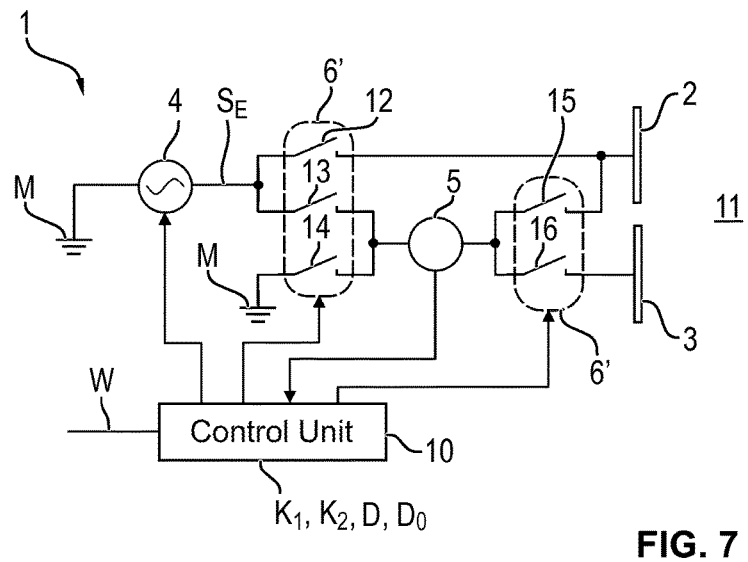
FIG. 7 is a block diagram that corresponds to FIG. 1 of an alternative embodiment of the sensor.
Figure 8:
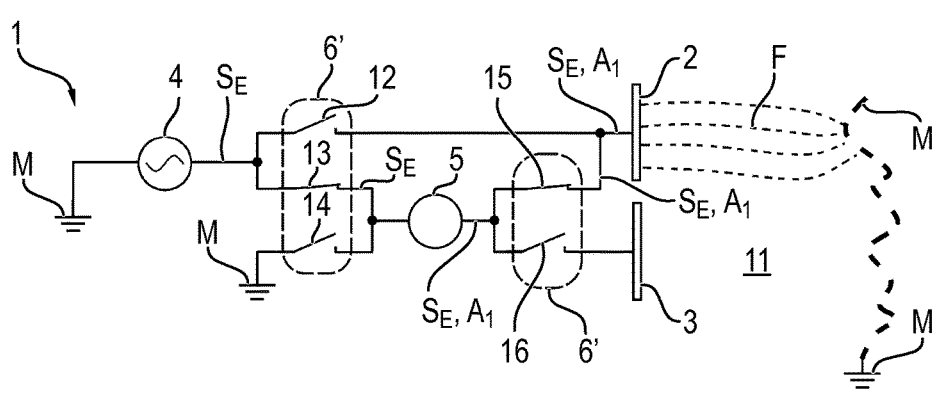
FIG. 8 is a block diagram that corresponds to FIG. 1 of the sensor shown in FIG. 7 during the single-electrode measurement.
Figure 9:
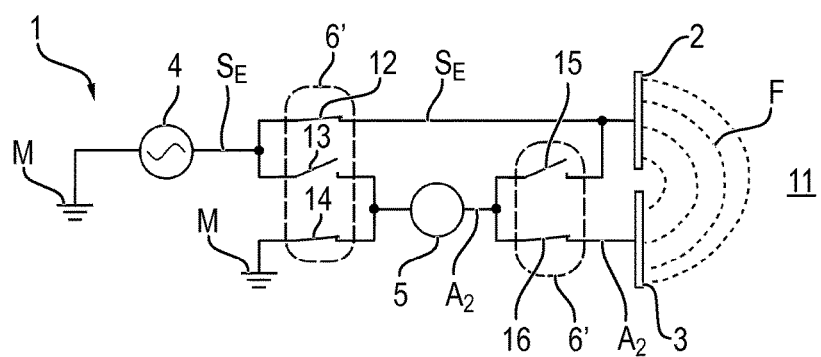
FIG. 9 is a block diagram that corresponds to FIG. 1 of the sensor shown in FIG. 7 during the transmitter-receiver measurement.

FIG. 7 to FIG. 9 show an alternative embodiment of the sensor 1. Instead of the switching apparatus 6, the sensor 1 here contains a modified switching apparatus 6' having switches 12, 13, 14, 15 and 16, which again are preferably formed by semiconductor switching elements.

The measuring electrode 2 can here be connected by the switching apparatus 6; to the signal generator circuit 4 alternately either directly via the switch 12 or indirectly via the switch 15, the receive circuit 5 and the switch 13. The measuring electrode 3 can be connected reversibly to ground M via the switch 16, the receive circuit 5 and the switch 14.

For the single-electrode measurement, the control unit 10 closes the switches 13 and 15 and opens the switches 12, 14 and 16, as shown in FIG. 8. This again means that the measuring electrode 3 is electrically isolated from the environment whereas the measuring electrode 2 is connected to the signal generator circuit 4 via the receive circuit 5. Alternatively, the measuring electrode 3 can again be taken to a defined electric potential, in particular tracking the potential of the measuring electrode 2. For the transmitter-receiver measurement, however, the control unit 10 closes the switches 12, 14 and 16 and opens the switches 13 and 15, as shown in FIG. 9. This means that the measuring electrode 2 is connected directly to the signal generator circuit 4, and the measuring electrode 3 is connected directly to the receive circuit 5. As regards the manner of operation, the sensor 1 shown in FIG. 7 to FIG. 9 is otherwise identical to the exemplary embodiment shown in FIG. 1 to FIG. 3.

As an alternative to the analysis described with reference to FIG. 4 to FIG. 6, the control unit 10 can also multiplicatively combine the deviations in the measured capacitance values $K_1$ and $K_2$ from the predetermined standard values $K_{10}$ and $K_{20}$ respectively (FIG. 4 and FIG. 5) in order to distinguish a body part approaching the sensor 1 from penetrating water. In this case, the sign of the resultant product signal is analyzed, which sign is negative for a synchronous change in the measured capacitance values $K_1$ and $K_2$ in the opposite direction, and is positive for a synchronous change in the measured capacitance values $K_1$ and $K_2$ in the same direction.

The described exemplary embodiments explain the invention particularly clearly but do not limit the invention. In fact a person skilled in the art can derive numerous further embodiments of the invention from the above description.

The following is a summary list of reference numerals and the corresponding structure used in the above description of the invention:
1 (proximity) sensor
2 (first) measuring electrode
3 (second) measuring electrode
4 signal generator circuit
5 receive circuit
6, 6' switching apparatus
7-9 switch
10 control unit
11 detection area
12-16 switch
M ground
$S_E$ transmit signal
$A_1$, $A_2$ response signal
F (electric) field
D summation signal
$D_0$ threshold value
W detection signal
t time
$t_0$ point in time
$K_1$, $K_2$ measured capacitance value
$K_{10}$, $K_{20}$ standard value

The invention claimed is:

1. A method for operating a capacitive proximity sensor having at least two measuring electrodes, which comprises the steps of:
    capturing a first measured capacitance value that is correlated with a capacitance of at least one of the measuring electrodes with respect to ground;
    capturing a second measured capacitance value that is correlated with the capacitance between at least one of the measuring electrodes and at least one further measuring electrode; and
    analyzing a change in the first measured capacitance value jointly with a synchronous signal waveform of the second measured capacitance value in order to distinguish an approach of a conductor electrically coupled to ground from an approach of dielectric material.

2. The method according to claim 1, which further comprises analyzing the change in the first measured capacitance value jointly with the synchronous signal waveform of the second measured capacitance value in order to distinguish an approach of a body part from an approach of water.

3. The method according to claim 1, which further comprises:
    detecting the approach of the electrical conductor coupled to ground, namely a body part, on identifying an opposite change in the first and second measured capacitance values; and
    detecting the approach of the dielectric material, namely water, on identifying a common change in the first and second measured capacitance values.

4. The method according to claim 3, which further comprises detecting the approach of the electrical conductor coupled to ground, namely the body part, by identifying a change in the first measured capacitance value without identifying a synchronous change in the second measured capacitance value.

5. The method according to claim 3, which further comprises:
    upon detecting the approach of the electrical conductor electrically coupled to ground, generating a detection signal and/or initiating a safety measure; and
    upon detecting the approach of the dielectric material, suppressing at least one of the detection signal or the safety measure.

6. A capacitive proximity sensor, comprising:
    an electrode configuration having two measuring electrodes;
    at least one signal generator for generating an electrical transmit signal for one of said measuring electrodes;
    at least one receive circuit for capturing a capacitance-dependent response signal from which a measured capacitance value can be derived; and
    a control unit configured to:
        capture a first measured capacitance value that is correlated with a capacitance of at least one of said two measuring electrodes with respect to ground;

capture a second measured capacitance value that is correlated with a capacitance between said two measuring electrodes; and analyze a change in the first measured capacitance value jointly with a synchronous signal waveform of the second measured capacitance value in order to distinguish an approach of a conductor electrically coupled to ground from an approach of a dielectric material.

7. The proximity sensor according to claim 6, wherein:
said signal generator circuit is connected to one of said measuring electrodes; and
said receive circuit can be connected alternately either to a same one of said measuring electrodes in order to capture a first response signal that represents the first measured capacitance value, or to another one of said measuring electrodes to capture a second response signal that represents the second measured capacitance value.

8. The proximity sensor according to claim 6, wherein:
said receive circuit is connected to one of said measuring electrodes; and
said signal generator can be connected alternately either to a same one of said measuring electrodes so that said receive circuit can capture a first response signal that represents the first measured capacitance value, or to another one of said measuring electrodes so that said receive circuit can capture a second response signal that represents the second measured capacitance value.

9. A control unit for a capacitive proximity sensor, the the capacitive proximity sensor containing an electrode configuration having at least two measuring electrodes, a signal generator for generating an electrical transmit signal for one of the measuring electrodes, and at least one receive circuit for capturing a capacitance-dependent response signal, the control unit configured to:

capture a first measured capacitance value that is correlated with a capacitance of at least one of the two measuring electrodes with respect to ground;

capture a second measured capacitance value that is correlated with a capacitance between the two measuring electrodes; and analyze a change in the first measured capacitance value jointly with a synchronous signal waveform of the second measured capacitance value in order to distinguish an approach of a conductor electrically coupled to ground from an approach of a dielectric material.

10. A non-transitory computer medium having machine-readable instructions which when executed in a microcontroller-based control unit of a capacitive proximity sensor implement automatically a method for operating the capacitive proximity sensor having at least two measuring electrodes, which comprises the steps of:

capturing a first measured capacitance value that is correlated with a capacitance of at least one of the two measuring electrodes with respect to ground;

capturing a second measured capacitance value that is correlated with a capacitance between the two measuring electrodes; and analyzing a change in the first measured capacitance value jointly with a synchronous signal waveform of the second measured capacitance value in order to distinguish an approach of a conductor electrically coupled to ground from an approach of a dielectric material.

* * * * *